United States Patent [19]
Gelatos et al.

[11] Patent Number: 5,324,690
[45] Date of Patent: Jun. 28, 1994

[54] SEMICONDUCTOR DEVICE HAVING A TERNARY BORON NITRIDE FILM AND A METHOD FOR FORMING THE SAME

[75] Inventors: Avgerinos V. Gelatos; Stephen S. Poon, both of Austin, Tex.

[73] Assignee: Motorola Inc., Schaumburg, Ill.

[21] Appl. No.: 11,919

[22] Filed: Feb. 1, 1993

[51] Int. Cl.$^5$ .................................. H01L 21/304
[52] U.S. Cl. ..................... 437/236; 148/DIG. 113; 427/255.2; 437/235
[58] Field of Search .............. 437/235, 236, 238, 240; 148/DIG. 113; 427/255.2

[56] References Cited

U.S. PATENT DOCUMENTS

| | | | |
|---|---|---|---|
| 4,789,648 | 12/1988 | Chow et al. | 437/225 |
| 4,910,155 | 3/1990 | Cote et al. | 437/8 |
| 4,944,836 | 7/1990 | Beyer et al. | 156/645 |
| 5,064,683 | 11/1991 | Poon et al. | 427/39 |
| 5,204,288 | 4/1993 | Marks et al. | 437/228 |
| 5,217,567 | 6/1993 | Cote et al. | 156/643 |

FOREIGN PATENT DOCUMENTS

| | | | |
|---|---|---|---|
| 0394054 | 10/1990 | European Pat. Off. | |
| 63-129631 | 6/1988 | Japan | 437/236 |

OTHER PUBLICATIONS

Maeda; "Effect of Oxygen Doping into SiBN Ternary Film"; Japanese Journal of Applied Physics; vol. 29, No. 9; pp. 1789–1794 (1990).

Maeda, et al.; "Low Dielectric Constant Amorphous SiBN Ternary Films Prepared by Plasma-Enhanced Deposition"; Japanese Journal of Applied Physics; vol. 26, No. 5; pp. 660–665 (1987).

Maeda, et al.; "A low-Permittivity Interconnection Using an SiBN Interlayer"; IEEE Transactions on Electron Devices; vol. 36, No. 9 (1989).

Nakahigashi, et al.; "Properties of the B-Si-N Ceramic Thin Films by Plasma-CVD"; Vacuum, vol. 31, No. 9, pp. 789–795 (1988).

Yamada et al., Improvements of Stress Controllability and Radiation Resistance by Adding Carbon to Boron-Nitride, J. Electrochem. Soc. vol. 137, No. 7, Jul. 1990, pp. 2242–2246.

*Primary Examiner*—Olik Chaudhuri
*Assistant Examiner*—Ken Horton
*Attorney, Agent, or Firm*—Jasper W. Dockrey

[57] ABSTRACT

A non-silyated, ternary boron nitride film (18, 38) is provided for semiconductor device applications. The non-silyated, ternary boron nitride film is preferably formed by plasma-enhanced chemical vapor deposition using non-silyated compounds of boron, nitrogen, and either oxygen, germanium, germanium oxide, fluorine, or carbon. In one embodiment, boron oxynitride (BNO) is deposited in a plasma-enhanced chemical vapor deposition reactor using ammonia ($NH_3$), diborane ($B_2H_6$), and nitrous oxide ($N_2O$). The BNO film has a dielectric constant of about 3.3 and exhibits a negligible removal rate in a commercial polishing apparatus. Because of its low dielectric constant and high hardness, the ternary boron nitride film formed in accordance with the invention can be advantageously used as a polish-stop layer and as a interlevel dielectric layer in a semiconductor device.

17 Claims, 2 Drawing Sheets

SEMICONDUCTOR DEVICE HAVING A TERNARY BORON NITRIDE FILM AND A METHOD FOR FORMING THE SAME

RELATED APPLICATION

This is related to U.S. patent application Ser. No. 08/012,177 filed Feb. 2, 1993.

FIELD OF THE INVENTION

This invention relates in general to a semiconductor device and method for fabricating a semiconductor device, and more particularly to a device having a ternary boron nitride and a method for forming the same.

BACKGROUND OF THE INVENTION

Recently, boron nitride (BN) films have found increasing application in semiconductor devices. For example, boron nitride films have been recognized as useful for dielectric isolation in integrated circuits where excessive signal propagation delay is caused by stray capacitance between adjacent electrically conductive leads. Boron nitride has a low dielectric constant relative to other commonly used insulators, such as silicon nitride and silicon dioxide. In addition, boron nitride exhibits high hardness. The high hardness of a boron nitride film enables it to be used as a polish-stop layer for a polish planarization process.

Although BN possesses many desirable characteristics, under certain conditions it can absorb moisture, which changes its physical and electrical properties. Additionally, unless care is taken during the deposition process to insure that a specific microstructure is formed, the BN film is somewhat brittle. In an effort to further enhance the utility of BN as a dielectric material, and to increase the toughness of BN, silicon has been added to boron nitride to form silicon boron nitride (SiBN). The addition of silicon to BN increase the durability and reduces water absorption characteristics of the film by stabilizing the microstructure of the BN during deposition. The actual structure of the film is a composite of silicon nitride and boron nitride. The low dielectric constant and film durability makes SiBN a useful interlevel dielectric material.

While the addition of silicon to BN yields improved film characteristics, advanced VLSI integrated circuits require dielectric films having even lower dielectric constants than that provided by SiBN. To further reduce the dielectric constant of SiBN, oxygen can be added to the SiBN film. An oxygen-doped SiBN film has a lower dielectric constant than undoped SiBN. Although a reduction in the dielectric constant is obtained with the addition of silicon to a BN film and a further reduction is observed with the addition of oxygen to SiBN, the addition of many elements makes the film deposition process more complex. For example, for each additional element, a source must be provided and a new set of optimum deposition conditions must be ascertained. Moreover, as the number of elements in the film increases, the control of the microstructure during film deposition becomes more difficult. In view of the advantages inherent in the use of BN as a thin-film in semiconductor devices, further development work is necessary to provide a high-quality BN film and deposition method.

SUMMARY OF THE INVENTION

The present invention includes a semiconductor device having a non-silyated, ternary boron nitride film and a method for the formation of a non-silyated, ternary boron nitride film. In one embodiment, a semiconductor substrate is provided and a ternary boron nitride film is formed on the substrate. The ternary boron nitride film is formed by a chemical vapor deposition method using non-silyated compounds of nitrogen, boron, and either oxygen, germanium, germanium oxide, fluorine, or carbon. The non-silyated, ternary boron nitride film formed in accordance with the invention is non-hygroscopic, and depending upon the particular formulation, shows either high hardness or a low dielectric constant. In one embodiment, boron oxynitride shows both high hardness and a low dielectric constant.

A method is provided for the formation of a ternary boron nitride polish-stop layer. The method includes providing a substrate having an uneven topography. A fill material is deposited to overlie the ternary boron nitride film and the recessed regions. A non-silyated, ternary boron nitride film is formed on the elevated regions and the fill material is polished back using the ternary boron nitride film as a polish-stop.

Further, a device structure is provided in which a non-silyated. As used herein, the term non-silyated refers to compounds which do not contain a silicon atom constituent, ternary boron nitride film is interposed between two electrically conductive leads. The non-silyated, ternary boron nitride film electrically insulates the leads and improves signal propagation through the leads by avoiding development of high capacitance between the leads.

Figure 1:
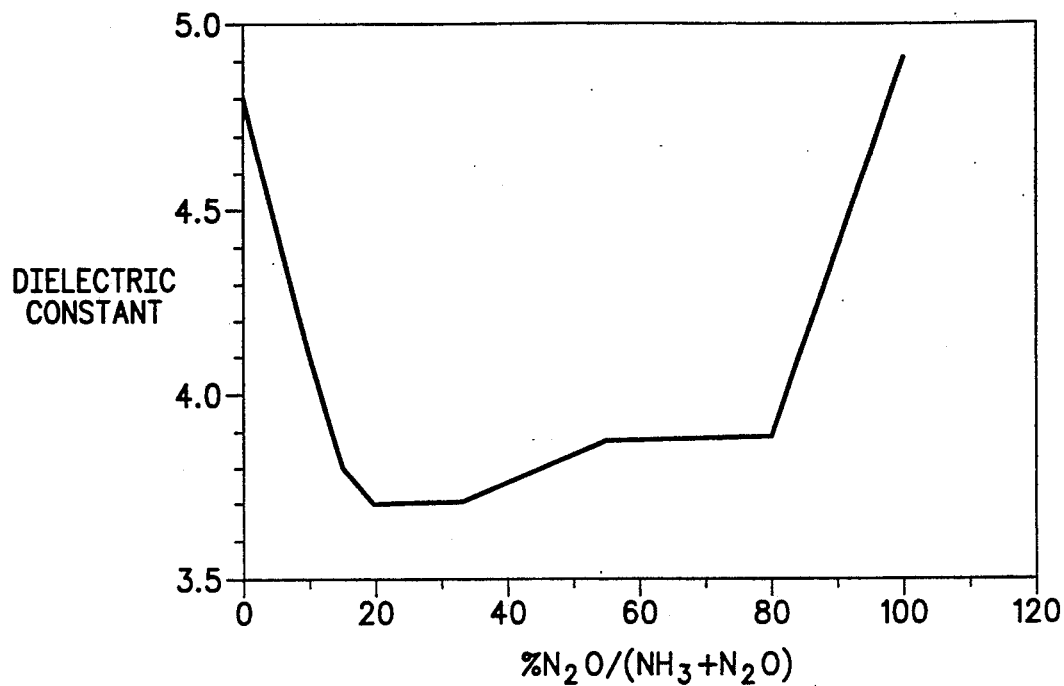
FIG. 1 is a plot of gas flow ratio versus the measured dielectric constant of a boron oxynitride film formed in accordance with the invention.

It will be appreciated that for simplicity and clarity of illustration elements shown in FIGS. 3-6 have not necessarily been drawn to scale. For example, the dimensions of some of the elements are exaggerated relative to each other for clarity. Further, where considered appropriate, reference numerals have been repeated among FIGS. 3-6 to indicate corresponding elements.

DETAILED DESCRIPTION OF THE PREFERRED EMBODIMENTS

The invention provides a non-silyated, ternary boron nitride film and a method of deposition for application to semiconductor devices. The ternary boron nitride film is preferably deposited using conventional chemical vapor deposition techniques. The ability to deposit the ternary boron nitride film by conventional methods, enables the deposition to be performed at a variety of stages during a semiconductor fabrication process. The ternary boron nitride film of the invention exhibits good step coverage, high hardness, chemical stability, and a low dielectric constant. The physical and electrical characteristics of the ternary boron nitride film formed in accordance with the invention permit a variety of applications in a semiconductor device. For example, the ternary boron nitride film of the invention can be used as a polish-stop layer and as an electrically insulating material. The preferred dopants include chemical species, which, when combined with boron nitride, form an electrically insulating compound.

Depending upon the particular film characteristics to be enhanced, the invention contemplates the addition of elements which provide increased hardness and which provide a low dielectric constant. In accordance with the invention, oxygen, germanium, or germanium oxide are provided to form a ternary boron nitride film having high hardness. Alternatively, oxygen, fluorine, or carbon are provided to form a ternary boron nitride film having a low dielectric constant.

In one embodiment, an oxygen-ternary boron nitride film is deposited by plasma-enhanced chemical vapor deposition (PECVD). A substrate upon which the ternary boron nitride film is to be deposited is placed in the deposition chamber of a PECVD reactor. The chamber is evacuated to a pressure of about 10 millitorr and reaction gasses are introduced. The preferred reaction gases include ammonia ($NH_3$), diborane ($B_2H_6$), and nitrous oxide ($N_2O$). The preferred flow rates are 100 to 300 sccm $NH_3$, 2000 to 4000 sccm $N_2$ (1 to 5 weight % $B_2H_6$), and 30 to 100 sccm $N_2O$. The most preferred flow rates are 144 sccm $NH_3$, 3000 sccm $N_2$ (2.5 weight % $B_2H_6$), and 56 sccm $N_2O$. Upon initiating the flow of reaction gases, the chamber pressure is maintained at about 4 to 6 torr. To initiate film deposition, about 100 Watts of radio frequency (RF) power is applied to the deposition chamber. The RF generator is operated at about 13.56 MHz. During film deposition, the substrate temperature is maintained at about 400° C. Using the foregoing deposition conditions, a boron oxynitride (BNO) film containing about 20 weight % oxygen is deposited onto the substrate at a rate of about 850 angstroms per minute.

The PECVD deposition process of the invention provides a BNO film at a relatively low temperature, which is a particular advantage of the invention. A deposition temperature of 400° C. is well below the temperature at which dopants diffuse in semiconductor materials. The low temperature PECVD deposition process permits the BNO film to be deposited after doped regions have been formed in the substrate. Thus, the BNO can be deposited after source and drain regions and shallow contact junctions have been formed in an MOS fabrication process or after base and emitter regions have been formed in a bipolar or BiCMOS fabrication process.

Figure 2:
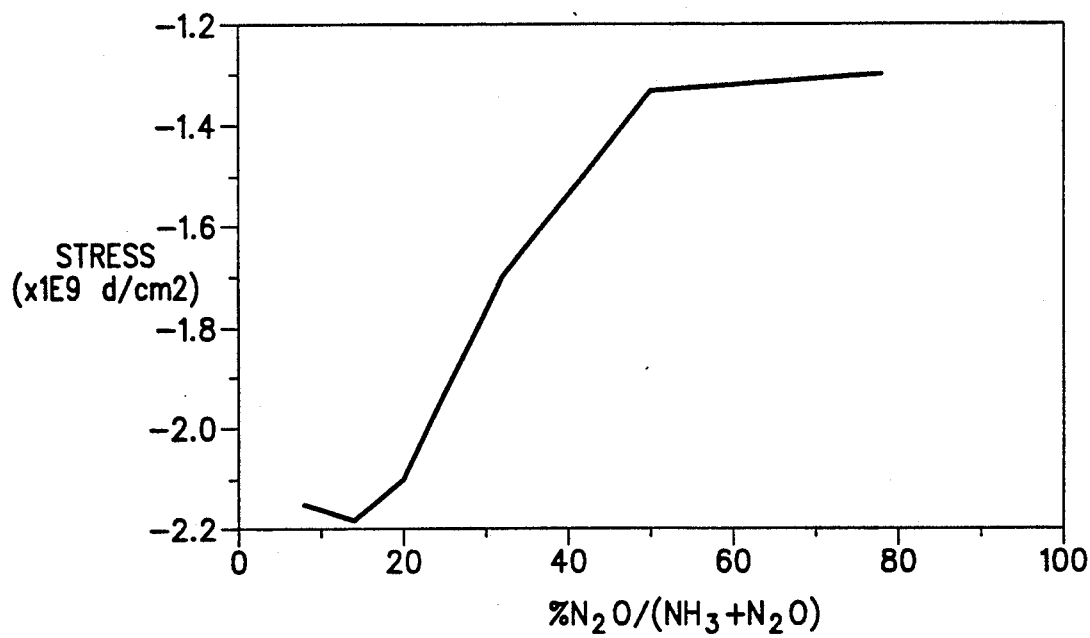
FIG. 2 is a plot of gas flow ratio versus the measured compressive stress of a boron oxynitride film formed in accordance with the invention.

The dielectric constant and the compressive stress of a BNO film deposited according to the above deposition conditions are shown in FIGS. 1 and 2. The dielectric constant and compressive stress of the boron oxynitride film is given in FIGS. 1 and 2 as a function of the mass flow rate of $N_2O$ in the source gas relative to the combined flow rate of $NH_3$ and $N_2O$. The BNO film was deposited using a constant total gas flow of about 3200 sccm and a deposition pressure of about 5.25 torr. The dielectric constant is obtained by measuring the permittivity (capacitance per unit area) of the BNO film $\epsilon$, and determining the ratio of $\epsilon$ for the BNO film to that of free space $\epsilon_0$. The plot of FIG. 1 shows that the dielectric constant reaches a minimum value as the amount of oxygen in the film is changed by varying the flow of $N_2O$. The method of the present invention is capable of producing a BNO film having a minimum dielectric constant of about 3.3.

The stress of the BNO film is given in FIG. 2 as a function of $N_2O$ flow rate relative to the combined flow rate of $NH_3$ and $N_2O$. In FIG. 2, the stress is in units of as dynes per square centimeter and has a negative value. The negative values indicate that the stress is compressive rather than tensile, which is expressed as positive values. Thus, as the amount of compressive stress increases, the negative values increase. The as-deposited compressive stress of a material proposed for use as a dielectric layer is important because if the film stress is high cracking can result. FIG. 2 indicates that the amount of film stress in the BNO varies as the oxygen concentration changes. The compressive stress is observed to decrease as the percentage of $N_2O$ increases. Importantly, as illustrated in FIG. 2, flow rate conditions exist which result in a minimal amount of stress in the as-deposited BNO film. A comparison of the plots shown in FIGS. 1 and 2 indicates that both the dielectric constant and the film stress can be kept relatively low for the BNO film when it is deposited using about 40–80% $N_2O/(NH_3+N_2O)$.

In the present invention, other compounds can be used as source gases for the deposition of the ternary boron nitride film. For example, in addition to diborane, boron can be supplied by other boron hydrides having the general formula $B_xH_y$, where x is an integer ranging from 2 to 20 and y is an integer ranging from 6 to 16. Further, boron can be obtained from an organoboron compound having the general formula $R_3B$, where R an alkyl group, such as methyl, ethyl, or butyl. Both boron and nitrogen can be supplied by borazine ($B_3N_3H_6$). In addition to ammonia and borazine, nitrogen can be supplied by an aminoboron compound having the general formula $(R)_3NBH_3$, where R is methyl or ethyl. In addition to $N_2O$, oxygen can be supplied by molecular oxygen gas or water vapor.

In another embodiment, a germanium ternary boron nitride film (GeBN) is formed on the substrate by plasma-enhanced chemical vapor deposition (PECVD). Reaction gases, such as ammonia ($NH_3$), diborane ($B_2H_6$), and germane ($GeH_4$) can be used. A GeBN film is deposited in a PECVD reactor using predetermined process parameters.

In yet another embodiment, fluorine is introduced to form boron fluoronitride (BFN). To deposit a BFN film, a PECVD is preferably carried out in a manner previously described. In the case of BFN, fluorine is provided by source gases, such as carbon tetrafluoride ($CF_4$), hexafluoroethane ($C_2F_6$), nitrogen trifluoride ($NF_3$), boron trifluoride ($BF_3$), and the like.

In still another embodiment, carbon is introduced to form carbonized boron nitride (CBN). To deposit a CBN film, a PECVD is preferably carried out in a manner previously described. In the case of CBN, carbon is provided by source gases, such as methane ($CH_4$), ethane ($C_2H_6$), and the like. In addition, fluorinated hydrocarbon gases, such as $CF_4$, $C_2F_6$, fluoromethane ($CHF_3$), and the like, can be used when hydrogen gas ($H_2$) is included in the reaction gas flow to the reactor.

Figure 3:
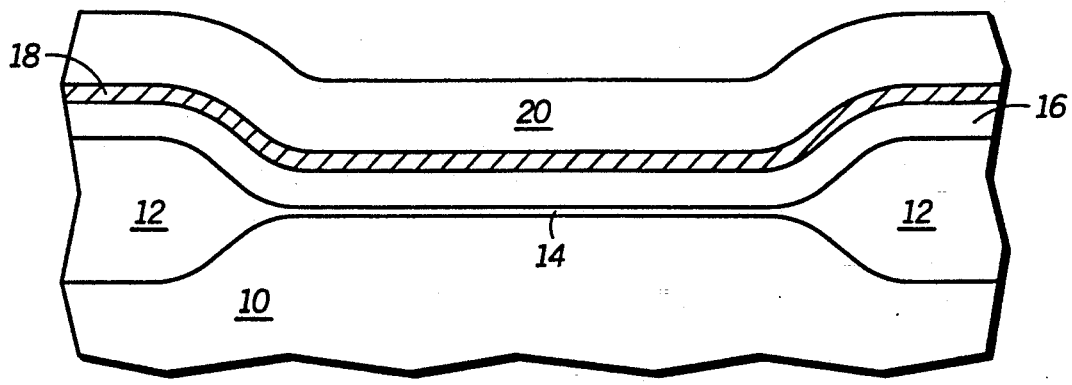
FIGS. 3-4, illustrate, in cross-section, polish planarization process steps in accordance with the invention.
Figure 4:
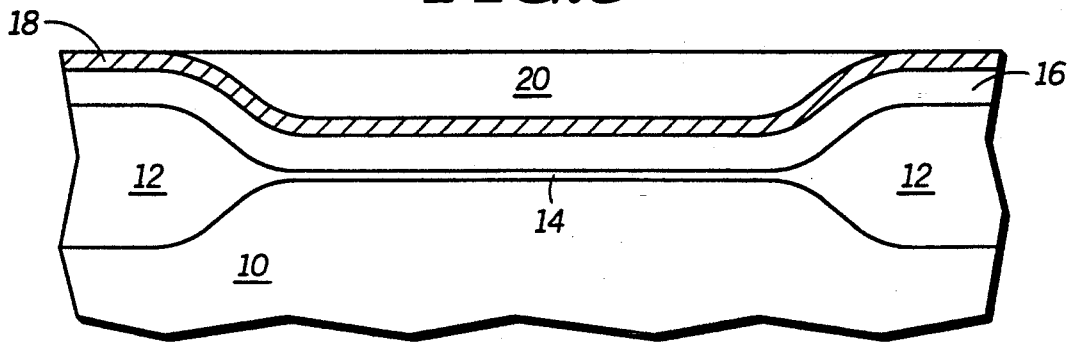
Figure 5:
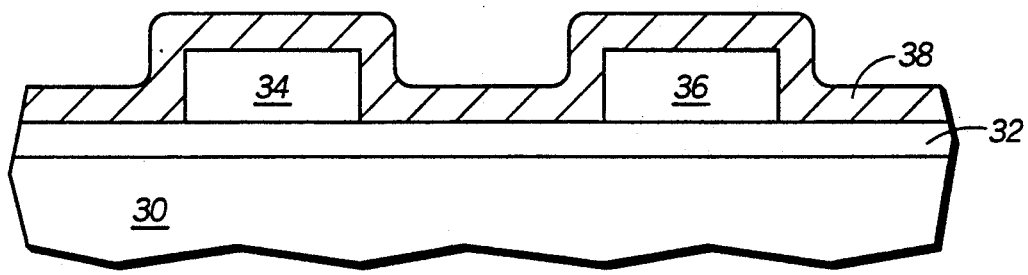
FIGS. 5-6, illustrate, in cross-section, embodiments of a semiconductor device in accordance with the invention, wherein a ternary boron nitride layer electrically insulates first and second conductive leads.
Figure 6:
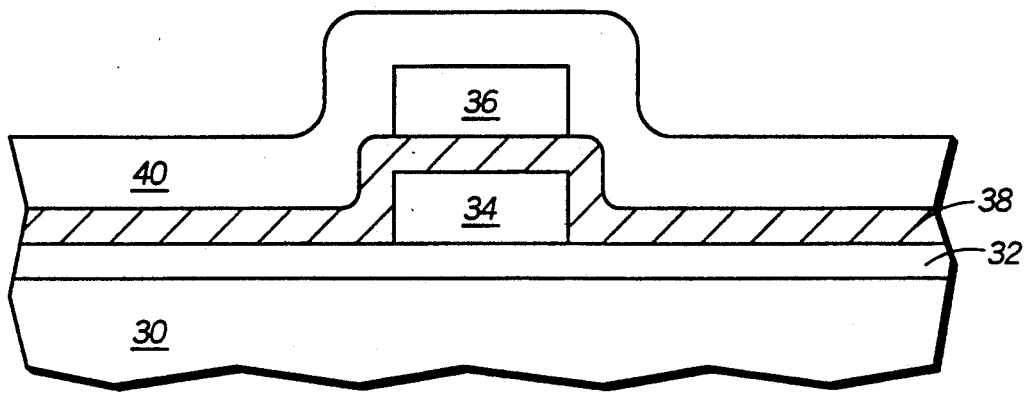

The ternary boron nitride film produced by the present invention can be advantageously used in a semiconductor device as an electrically insulting film and a polish-stop layer. FIGS. 3 and 4 illustrate a method in accordance with the invention in which a ternary boron nitride polish-stop layer is deposited during semiconductor device fabrication. FIGS. 5 and 6 illustrate exemplary embodiments in which a ternary boron nitride film functions as a dielectric material electrically insulating adjacent leads in a semiconductor device.

FIG. 3 illustrates, in cross section, a semiconductor device structure formed in accordance with one embodiment of the invention. While not intended to depict any particular device, the structure shown in FIG. 3 illustrates the application of the invention to the fabrication of a semiconductor device. The device structure includes a semiconductor substrate 10 having field oxide regions 12 formed thereon. The field oxide creates both elevated and recessed regions on the substrate. Those skilled in the art recognize that elevated and recessed regions can be created by other isolation techniques, such as trench isolation and the like. Additionally, elevated and recessed regions can be created by electrical interconnect structures, such as electrical leads and contact openings, and the like.

A dielectric layer 14 overlies the surface of substrate 10 and a doped glass layer 16 overlies dielectric layer 14 and field oxide regions 12. A ternary boron nitride polish-stop layer 18 overlies doped glass layer 16 and separates dielectric layer 16 from a planarizing layer 20 overlying polish-stop layer 18. Preferably, polish-stop layer 18 is BNO. Alternatively, polish-stop layer 18 can be GeBN, where germanium can be either elemental Ge or $GeO_2$. Planarizing layer 20 can be a dielectric material, such as a low temperature silicon oxide (LTO) deposited using tetraethylorthosilicate (TEOS), a silicon oxide layer doped with phosphorus (PSG), a silicon oxide layer doped with boron and phosphorus (BPSG), and the like. Alternatively, planarizing layer 20 can be a semiconductor material, such as polysilicon doped with either phosphorus or boron, a conductive refractory metal, such as tungsten, titanium, molybdenum, cobalt, and silicides of those refractory metals, and the like. The structure illustrated in FIG. 3 may occur in a variety of semiconductor devices, for example, in the fabrication of MOS SRAM and DRAM devices or microprocessor devices which include EPROM or EEPROM memory arrays, or other devices using isolation structures, such as bipolar and BiCMOS devices.

Planarizing layer 20 is processed by placing the structure in a polishing apparatus, wherein planarizing layer 20 is polished back until polish-stop layer 18 is reached, as shown in FIG. 4. The polishing operation is preferably carried out in a polishing apparatus having a rotating polish wheel and a polyurethane polishing pad disposed on the polishing wheel. One such commercially available polishing apparatus is the "WESTECH 372" manufactured by Westech Inc. of Phoenix, Ariz. A commercially available slurry comprised of colloidal silica suspended in potassium hydroxide (KOH) is applied to the polishing pad. The planarizing layer 20 is removed until the polish-stop layer 18 is reached. In the case of oxygen ternary boron nitride, under standard polishing conditions and a pad pressure ranging from 3 to 10 pounds-per-square-inch (psi), a negligible removal rate of BNO has been observed. The other polishing conditions are summarized as follows: platen temperature of 38° C.; 150 rpm platen speed; slurry flow rate about 175 SCCM, (CABOT SC1 slurry manufactured by Nalco Chemical Co.); 42 rpm carrier speed; SUBA4/IC60 polish pad, manufactured by Rodel Products Corp. of Scottsdale, Ariz. Following the primary polish, a deionized water rinse solution is applied at a secondary platen. Upon exposure of polish-stop layer 18, the removal of any remaining portions of the substrate, and layers thereon, virtually ceases resulting in a smooth planar surface.

The polishing operation forms a smooth planar surface with a highly uniform flatness. The high polish selectivity obtainable with ternary boron nitride permits the polishing operation to be extended beyond the point where polish-stop layer 18 is first exposed. The polish time can be extended for a sufficient amount of time to remove all portions of planarizing layer 20 protruding above the plane of polish-stop layer 18. After polishing back planarizing layer 20, substrate 10 is cleaned in a conventional chemical cleaning process, such as a solution of hydrogen peroxide and ammonium hydroxide followed by a solution of hydrochloric acid, hydrogen peroxide and water, in turn followed by a solution of sulfuric acid and hydrogen peroxide, or a variation thereof.

In addition to exhibiting high hardness, the ternary boron nitride film of the present invention also has a low dielectric constant, as previously described. The ability to deposit a ternary boron nitride layer in a conformal manner, using conventional PECVD techniques, coupled with a low dielectric constant makes ternary boron nitride a desirable alternative to silicon oxide and silicon nitride as an inter-layer dielectric material.

Shown in FIG. 6 is a portion of a semiconductor device having a ternary boron nitride electrical insulation layer. A semiconductor substrate 30 supports a dielectric layer 32 and first and second electrical leads 34 and 36 respectively. A ternary boron nitride insulation layer 38 overlies leads 34 and 36, and dielectric layer 32. Preferably, insulation layer 38 is BNO. Alternatively, insulation layer 38 can be BNF or BNC. The structure shown in FIG. 5 is a generalized depiction of a portion of a semiconductor device. Those skilled in the art will appreciate that leads 34 and 36 can perform a number of different functions in a semiconductor device. For example, leads 34 and 36 can be metal interconnects electrically coupling two or more components of a semiconductor integrated circuit. Additionally, leads 34 and 36 can be MOS gate electrodes. In the case of MOS gate electrodes, leads 34 and 36 are composed of a semiconductor material, such as doped polysilicon, a polysilicon-refractory metal silicide material, gallium arsenide, and the like. Preferably, insulation layer 38 is deposited according to the previously described PECVD method.

One example of a different arrangement of leads 34 and 36 is illustrated in FIG. 6. Ternary boron nitride insulation layer 38 is deposited to overlie lead 34. A conductive layer is then deposited onto insulation layer 38 and etched to form lead 36. Insulation layer 38 separates and electrically isolates leads 34 and 36. A passivation layer 40 overlies lead 36 and insulation layer 38. The exemplary embodiment shown in FIG. 6 is typical of a multi-level metal structure used in VLSI integrated circuits. Those skilled in the art appreciate that many different kinds of insulating materials can be used for dielectric layer 32 and passivation layer 40. For example, dielectric layer 32 can be PSG, BSG, or BPSG. Alternatively, dielectric layer 32 can be TEOS, or spin-on glass (SOG) layer. Passivation layer 40 can be, for example, plasma deposited silicon nitride, SOG, LTO, and the like.

Thus it is apparent that there has been provided, in accordance with the invention, a semiconductor device having a non-silyated boron nitride film and method which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the boron oxynitride layer can be used as both a polish-stop layer, and as an insulating layer. For example, following the deposition of a planarization layer over a ternary boron nitride layer and polishing the planarization layer, the ternary boron nitride layer is retained and a conductive layer is deposited over the ternary boron nitride layer. In addition, dopants can be added to the ternary boron nitride film to alter or enhance one or more of its various properties. It is therefore intended to include within the invention all such variations and modifications as fall within the scope of the appended claims and equivalents thereof.

We claim:

1. A method for fabricating a semiconductor device comprising the steps of:
   providing a semiconductor substrate; and
   forming a ternary boron nitride film on the substrate by a chemical vapor deposition method using non-silyated compounds of nitrogen, boron, and an additional substance selected from a group consisting of oxygen, germanium, and fluorine.

2. The method of claim 1, wherein the chemical vapor deposition method comprises plasma-enhanced chemical vapor deposition.

3. The method of claim 1, wherein;
   the nitrogen compound is selected from a group consisting of elemental nitrogen, ammonia, and an aminoboron compound having the general formula $(R)_3NBH_3$,
   wherein R is selected from a group consisting of methyl and ethyl;
   the boron compound is a selected from a group consisting of boron hydride, borazine, and an organoboron; and
   the additional substance is an oxygen compound, wherein the oxygen compound is selected from a group consisting of nitrous oxide, oxygen, and water.

4. The method of claim 3, wherein the boron hydride has the formula $B_xH_y$, wherein x is an integer ranging from 2 to 20 and y is an integer ranging from 6 to 16.

5. The method of claim 3, wherein the organoboron has the formula $R_3B$, where R is selected from a group consisting of methyl, ethyl, and butyl.

6. A method for fabricating a semiconductor device comprising the steps of:
   providing a substrate having an uneven topography including elevated regions and recessed regions;
   providing a non-silyated, ternary boron nitride film on the uneven topography of the substrate, wherein the ternary boron nitride film is selected from a group consisting of boron oxynitride, boron germanium nitride, and boron germanium oxynitride;
   depositing a fill material to overlie the ternary boron nitride film and the recessed regions; and
   polishing back the fill material using the ternary boron nitride film as a polish-stop.

7. The method of claim 6, wherein the step of polishing is performed using a silica-based slurry material.

8. The method of claim 6, wherein the fill material is selected from a group consisting of silicon oxide, silicon oxide doped with phosphorus, and silicon oxide doped with boron and phosphorus.

9. The method of claim 6, wherein the fill material is selected from a group consisting of polysilicon, tungsten, titanium, molybdenum, cobalt and silicides of tungsten, titanium, molybdenum, and cobalt.

10. A method for fabricating a semiconductor device comprising the steps of:
    providing a substrate having recessed regions and protruding regions;
    depositing a non-silyated, ternary boron nitride layer to overlie the substrate, wherein the ternary boron nitride layer is boron oxynitride deposited by plasma-enhanced chemical vapor deposition using compounds of nitrogen, boron, and oxygen;
    depositing at least one layer of fill material to overlie the ternary boron nitride layer, wherein the at least one layer of fill material has a polishing removal rate greater than the ternary boron nitride layer;
    placing the substrate in a polishing apparatus, wherein the substrate is brought into contact with a rotating polishing wheel and a polishing pad disposed on the wheel;
    applying a slurry including silica suspended in KOH to the polishing pad; and
    polishing back the at least one layer of fill material until the boron oxynitride layer is reached.

11. The method of claim 10, wherein;
    the nitrogen compound is selected from a group consisting of molecular nitrogen, ammonia, and an aminoboron compound having the formula $(R)_3NBH_3$, wherein R is selected from a group consisting of methyl and ethyl;
    the boron compound is a selected from the group consisting of a boron hydride, borazine, and an organoboron; and
    the oxygen compound is nitrous oxide.

12. The method of claim 11, wherein the boron hydride has the formula $B_xH_y$, wherein x is an integer ranging from 2 to 20 and y is an integer ranging from 6 to 16.

13. The method of claim 11, wherein the organoboron has the formula $R_3B$, wherein R is selected from a group consisting of methyl, ethyl, and butyl.

14. A method for fabricating a semiconductor device comprising the steps of:
    providing a semiconductor substrate;
    forming a first interconnect layer on the substrate;
    forming a, ternary boron nitride film overlying the first interconnect layer, wherein ternary boron nitride film is formed by a chemical vapor deposition method using non-silyated compounds of nitrogen, boron, and an element selected from a group consisting of oxygen, and fluorine; and
    forming a second interconnect layer overlying the ternary boron nitride layer, wherein the non-silyated, ternary boron nitride film electrically insulates the second interconnect layer from the first interconnect layer.

15. The method of claim 14, wherein;
    the nitrogen compound is selected from a group consisting of elemental nitrogen, ammonia, and an aminoboron compound having the formula $(R)_3NBH_3$, wherein R is selected from a group consisting of methyl and ethyl;

the boron compound is a selected from a group consisting of a boron hydride, borazine, and organoboron; and the oxygen compound is nitrous oxide.

16. The method of claim 15, wherein the boron hydride has the formula $B_xH_y$, wherein x is an integer ranging from 2 to 20 and y is an integer ranging from 6 to 16.

17. The method of claim 15, wherein the organoboron has the formula $R_3B$, wherein R is selected from s group consisting of methyl, ethyl, and butyl.

* * * * *